(12) United States Patent
Xu et al.

(10) Patent No.: US 12,400,580 B2
(45) Date of Patent: Aug. 26, 2025

(54) DISPLAY PANEL AND DISPLAY APPARATUS

(71) Applicant: Hefei Visionox Technology Co., Ltd., Anhui (CN)

(72) Inventors: Chuanzhi Xu, Hefei (CN); Zhengfang Xie, Hefei (CN); Xiangqian Wang, Hefei (CN)

(73) Assignee: HEFEI VISIONOX TECHNOLOGY CO., LTD., Hefei (CN)

(*) Notice: Subject to any disclaimer, the term of this patent is extended or adjusted under 35 U.S.C. 154(b) by 0 days.

(21) Appl. No.: 18/356,375

(22) Filed: Jul. 21, 2023

(65) Prior Publication Data
US 2024/0021148 A1 Jan. 18, 2024

Related U.S. Application Data

(63) Continuation of application No. PCT/CN2022/095717, filed on May 27, 2022.

(30) Foreign Application Priority Data

Oct. 22, 2021 (CN) .......................... 202111234915.5

(51) Int. Cl.
G09G 3/32 (2016.01)
(52) U.S. Cl.
CPC ....... *G09G 3/32* (2013.01); *G09G 2300/0426* (2013.01)
(58) Field of Classification Search
CPC ...... G09G 3/32; G09G 3/3233; G09G 3/3225; G09G 2300/0426; H10K 59/121;
(Continued)

(56) References Cited

U.S. PATENT DOCUMENTS 11,282,909 B2 * 3/2022 Liu .................. H10K 50/813
2003/0210218 A1 * 11/2003 Hebiguchi ........... G09G 3/3659
345/90
(Continued)

FOREIGN PATENT DOCUMENTS

CN 110783487 A 2/2020
CN 111430415 A 7/2020
(Continued)

OTHER PUBLICATIONS

Office Action issued on Sep. 10, 2023, in corresponding Chinese Application No. 202111234915.5 9 pages.
(Continued)

*Primary Examiner* — David Tung
(74) *Attorney, Agent, or Firm* — Maier & Maier, PLLC

(57) ABSTRACT

A display panel and a display apparatus. The display panel includes: a base plate including a substrate and first pixel circuits, each of the first pixel circuits including two or more driving elements; and a light-emitting device layer arranged on the base plate and including first sub-pixels, each of the first sub-pixels including a first electrode layer, a first light-emitting layer, and a second electrode layer; at least part of the first pixel circuits being configured to drive two or more of the first sub-pixels, the two or more driving elements of the first pixel circuit being dispersedly distributed in an area covered by at least part of the first sub-pixels driven by the first pixel circuit, and an orthographic projection of the first electrode layer on the substrate covering an orthographic projection of the driving element on the substrate.

20 Claims, 6 Drawing Sheets

(58) Field of Classification Search
CPC ......... H10K 59/80414; H10K 59/1213; H10K 59/65; H10K 59/131; H10K 59/122; H10K 59/35; H10K 59/805
See application file for complete search history.

(56) References Cited

U.S. PATENT DOCUMENTS

| | | | | |
|---|---|---|---|---|
| 2014/0346444 | A1* | 11/2014 | Chung | H10K 71/00 438/34 |
| 2015/0029235 | A1 | 1/2015 | Sato | |
| 2015/0077680 | A1* | 3/2015 | Won | G02F 1/133514 257/89 |
| 2018/0342570 | A1* | 11/2018 | Hong | H10K 59/1216 |
| 2020/0211473 | A1* | 7/2020 | Kim | G09G 3/3291 |
| 2020/0227508 | A1* | 7/2020 | Kim | H10K 59/121 |
| 2022/0069027 | A1* | 3/2022 | Wang | H10K 59/124 |
| 2022/0208886 | A1* | 6/2022 | Kim | H10K 59/353 |
| 2022/0336540 | A1* | 10/2022 | Shang | H10K 59/353 |
| 2022/0336562 | A1* | 10/2022 | Shang | H10K 59/126 |
| 2022/0415996 | A1* | 12/2022 | Jeong | H10K 59/1213 |
| 2023/0306904 | A1* | 9/2023 | Huang | G09G 3/3233 |

FOREIGN PATENT DOCUMENTS

| | | |
|---|---|---|
| CN | 210955904 U | 7/2020 |
| CN | 109671757 B | 8/2020 |
| CN | 111668263 A | 9/2020 |
| CN | 112038381 A | 12/2020 |
| CN | 112117320 A | 12/2020 |
| CN | 112825233 A | 5/2021 |
| CN | 112992986 A | 6/2021 |
| CN | 113053988 A | 6/2021 |
| CN | 113394236 A | 9/2021 |
| CN | 113782581 A | 12/2021 |
| CN | 113809141 A | 12/2021 |
| KR | 1020200087384 A | 7/2020 |

OTHER PUBLICATIONS

International Search Report mailed on Mar. 30, 2021, in corresponding International Application No. PCT / CN2022/095717, 6 pages (partial English translation provided).
Office Action issued on May 16, 2025, in corresponding Korean Application No. 10-2023-7026106, 13 pages.

* cited by examiner

DISPLAY PANEL AND DISPLAY APPARATUS

CROSS-REFERENCE TO RELATED APPLICATIONS

The present application is a continuation of International Application No. PCT/CN2022/095717 filed on May 27, 2022, which claims priority to Chinese Patent Application No. 202111234915.5 filed on Oct. 22, 2021, both of which are incorporated herein by reference in their entireties.

TECHNICAL FIELD

The present application relates to the field of display technology, and particularly to a display panel and a display apparatus.

BACKGROUND

With the development of display technology, functions of a display panel increase. It is necessary to integrate photosensitive components such as cameras and infrared photosensitive elements on the display panel to implement functions such as display, shoot, and photosensitivity. In order to increase the screen-to-body ratio, a light-transmitting display area may be arranged on the display panel, and the photosensitive components may be arranged at the back of the light-transmitting display area.

In order to ensure that the photosensitive components can operate normally, the light transmission of the light-transmitting display area needs to be better, therefore a display panel that can improve the light transmission of the light-transmitting display area is required.

SUMMARY

Embodiments of the present application provide a display panel and a display apparatus that can improve the light transmission of the light-transmitting display area.

In a first aspect, the embodiments of the present application provide a display panel including a first display area and a second display area, a light transmittance of the first display area being greater than a light transmittance of the second display area, the display panel including: a base plate including a substrate and first pixel circuits arranged in the first display area, each of the first pixel circuits including two or more driving elements; and a light-emitting device layer arranged on the base plate and including first sub-pixels arranged in the first display area, each of the first sub-pixels including a first electrode layer, a first light-emitting layer, and a second electrode layer; at least part of the first pixel circuits being configured to drive two or more of the first sub-pixels, the two or more driving elements of the first pixel circuit being dispersedly distributed in an area covered by at least part of the first sub-pixels driven by the first pixel circuit, and an orthographic projection of the first electrode layer on the substrate covering an orthographic projection of the driving element on the substrate.

In a second aspect, the embodiments of the present application provide a display apparatus including the display panel in the first aspect.

The embodiments of the present application provide a display panel and a display apparatus, the display panel includes the first display area and the second display area. The driving elements in the first pixel circuit configured to drive the first sub-pixels in the first display area can be dispersedly distributed in an area covered by at least part of the first sub-pixels driven by the first pixel circuit, and an orthographic projection of the first electrode layer of the first sub-pixel on the substrate covers an orthographic projection of the driving element on the substrate, so as to prevent the driving elements in the first pixel circuit from shielding light, reduce the light-shielding area of the first display area, and improve the light transmission of the first display area, i.e., the light-transmitting display area.

BRIEF DESCRIPTION OF THE DRAWINGS

In order to illustrate technical solutions of embodiments of the present application more clearly, the drawings required for the embodiments of the present application will be briefly described below. For a person ordinarily skilled in the art, other drawings can be further obtained from these drawings without any inventive effort.

DETAILED DESCRIPTION

Features of various aspects and exemplary embodiments of the present application will be described in detail below. In order to make objects, technical solutions and advantages of the present application clearer, the present application is further described in detail below with reference to the drawings and specific embodiments. It should be understood that the specific embodiments described herein are merely for illustrating the present application, but not for limiting the present application. For those skilled in the art, the present application can be implemented without some of these specific details. The following description of the embodiments is merely to provide a better understanding of the present application by illustrating the examples of the present application.

With the development of display technology, demands of users for the screen-to-body ratio of the display panel are higher and higher. In a display apparatus such as a mobile phone and a tablet computer, photosensitive components such as a front camera, an infrared light sensor, and a proximity light sensor need to be integrated at a side of the display panel. A light-transmitting display area may be arranged on the display panel and the photosensitive components may be arranged at the back of the light-transmitting display area, so that a full-screen display can be achieved for the display panel while ensuring that the photosensitive components operate normally. In order to ensure that the photosensitive components operate normally, the light-transmitting display area needs to have good light-transmitting performance. However, the pixel circuits of the sub-pixels in the light-transmitting display area would adversely affect the light transmission of the light-transmitting display area, the functions of the light-transmitting display area are adversely affected and thus the performance of the display panel is degraded.

Embodiments of the present application provide a display panel and a display apparatus that can improve the light transmission of the light-transmitting display area under a condition that the pixel circuits of the sub-pixels in the light-transmitting display area are arranged in the light-transmitting display area, so as to ensure the performance of the display panel.

Figure 1:
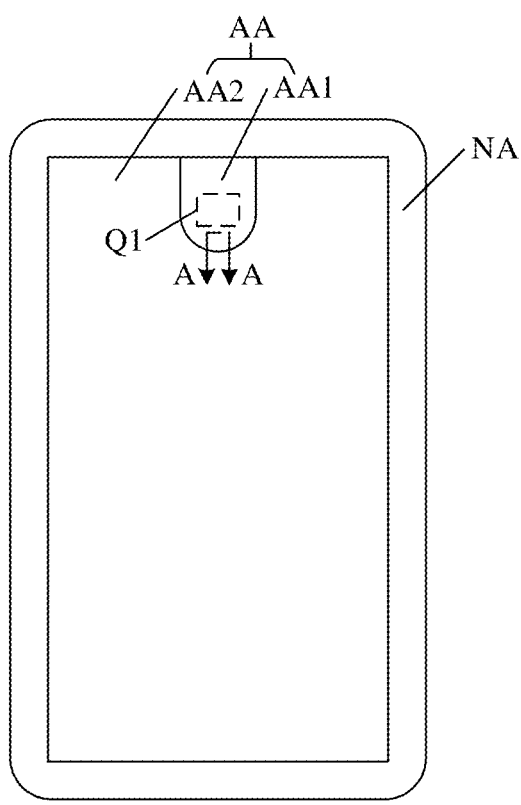
FIG. 1 shows a schematic top view of a display panel according to an embodiment of the present application.

FIG. 1 shows a schematic top view of a display panel according to an embodiment of the present application. As shown in FIG. 1, the display panel includes a display area AA and a non-display area NA. The display area AA includes a first display area AA1 and a second display area AA2, that is, the display panel includes the first display area AA1 and the second display area AA2.

The second display area AA2 surrounds at least part of the first display area AA1. A light transmittance of the first display area AA1 is greater than a light transmittance of the second display area AA2, and the first display area AA1 is a light-transmitting display area. For example, the light transmittance of the first display area AA1 may be greater than or equal to 15%, even greater than 40%, or much greater. The light transmittance of the first display area AA1 is greater than the light transmittance of the second display area AA2, so that the photosensitive components can be integrated at the back of the first display area AA1 of the display panel, while the first display area AA1 can still display images, the screen-to-body ratio of the display panel is increased and a full-screen design is achieved for the display panel.

Figure 2:
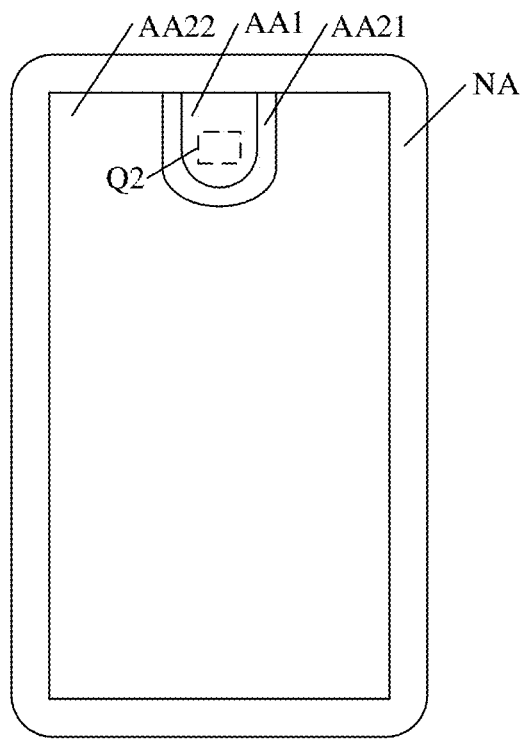
FIG. 2 shows a schematic top view of a display panel according to another embodiment of the present application.

In some examples, the first display area in the embodiments described above may include a first area and a second area. FIG. 2 shows a schematic top view of a display panel according to another embodiment of the present application. As shown in FIG. 2, the second display area AA2 may include a first area AA21 and a second area AA22. The first area AA21 is located between the second area AA22 and the first display area AA1. The second area AA22 may surround at least part of the first area AA21. A light transmittance of the first area AA21 is greater than a light transmittance of the second area AA22. The structure of area Q2 shown in FIG. 2 is the same as the structure of area Q1 shown in FIG. 1, which is not repeated herein.

Figure 3:
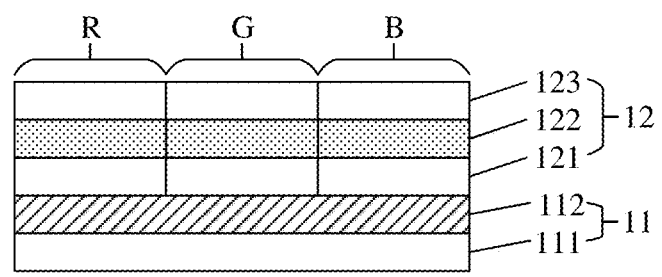
FIG. 3 shows a simplified cross-sectional view of an example along A-A in FIG. 1.

FIG. 3 shows a simplified cross-sectional view of an example along A-A in FIG. 1. As shown in FIG. 3, the display panel may include a base plate 11 and a light-emitting device layer 12.

The base plate 11 includes a substrate 111 and first pixel circuits arranged in the first display area.

For ease of indicating, the layer in which the first pixel circuits are located is indicated as 112 in FIG. 3. The first pixel circuits can be configured to drive the sub-pixels in the first display area.

The first pixel circuit includes two or more driving elements. In some examples, the driving elements may include a transistor, a capacitor, and other components, which is not limited herein.

The light-emitting device layer 12 is arranged on the substrate 11. The light emitting device layer 12 includes first sub-pixels arranged in the first display area. The first sub-pixels may include red sub-pixels R, green sub-pixels G, and blue sub-pixels B, which is not limited herein. The first sub-pixel includes a first electrode layer 121, a first light-emitting layer 122, and a second electrode layer 123. In some examples, the first electrode layer may include a pixel anode and the second electrode layer may include a pixel cathode.

The first pixel circuits described above may be configured to drive the first sub-pixels. In the embodiments of the present application, at least part of the first pixel circuits may be configured to drive two or more of the first sub-pixels, and the number of the pixel circuits capable of driving two or more of the first sub-pixels is not limited herein. For example, all first pixel circuits in the first display area may be configured to drive two or more of the first sub-pixels. As another example, a part of the first pixel circuits in the first display area are configured to drive two or more of the first sub-pixels, and the other part of the first pixel circuits are configured to drive one of the first sub-pixels.

The two or more driving elements of the first pixel circuit are dispersedly distributed in an area covered by at least part of the first sub-pixels driven by the first pixel circuit, and an orthographic projection of the first electrode layer on the substrate covers an orthographic projection of the driving element on the substrate. The driving elements are distributed in the area covered by the first sub-pixels, and the orthographic projection of the first electrode layer on the substrate covers the orthographic projection of the driving element on the substrate, which can prevent the driving elements of the first pixel circuits from shielding light, and thus the light transmission of the first display area is improved.

The circuit structure of the first pixel circuit is not limited herein. In some examples, the first pixel circuit may include any of a 2T1C circuit, a 7T1C circuit, a 7T2C circuit, a 9T1C circuit and the like. Herein, the "2T1C circuit" refers to a pixel circuit including two thin film transistors (T) and one capacitor (C), and the same applies to the "7T1C circuit", "7T2C circuit", "9T1C circuit" and the like.

Figure 4:
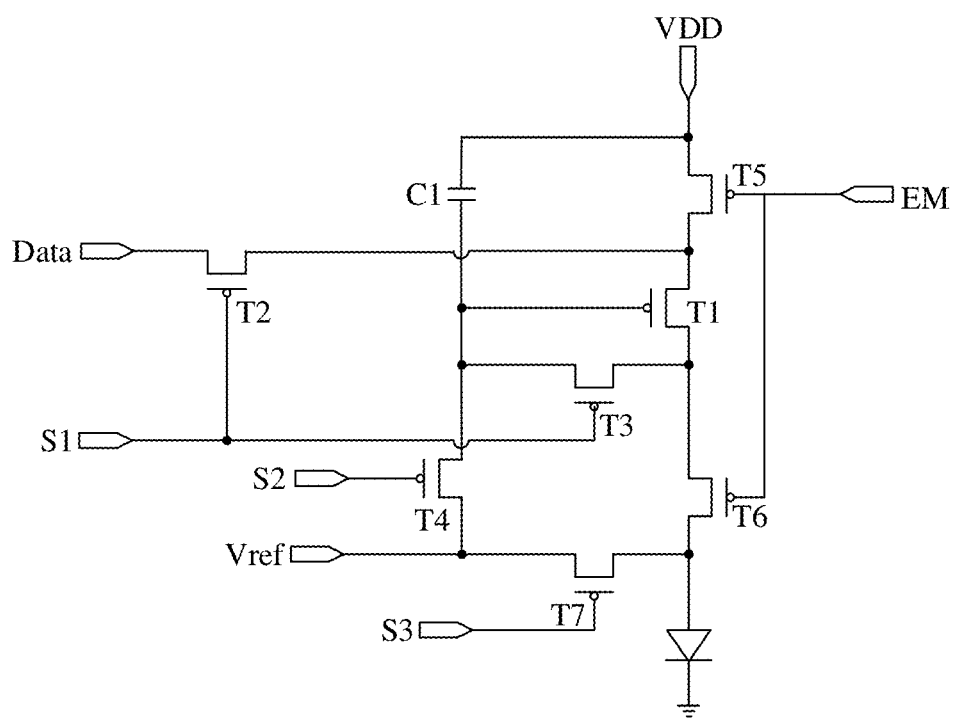
FIG. 4 shows a schematic structural diagram of an example of a first pixel circuit in the embodiments of the present application.

For ease of understanding, in the following description, for example, the first pixel circuit is a 7T1C circuit. FIG. 4 shows a schematic structural diagram of an example of a first pixel circuit in the embodiments of the present application. As shown in FIG. 4, the driving element in the first pixel circuit includes a first transistor T1, a second transistor T2, a third transistor T3, a fourth transistor T4, a fifth transistor T5, a sixth transistor T6, a seventh transistor T7, and a first capacitor C1. The connection relationships among the various transistors and the capacitor can be seen in FIG. 4, which is not repeated herein.

A first terminal of the second transistor T2 is connected with a data signal line Data. Control terminals of the second transistor T2 and the third transistor T3 are connected with a first scan signal line S1. A control terminal of the fourth transistor T4 is connected with a second scan signal line S2. A first terminal of the fifth transistor T5 and one terminal of the first capacitor C1 are connected with a power supply signal line VDD. Control terminals of the fifth transistor T5 and the sixth transistor T6 are connected with a light-emitting control signal line EM. A control terminal of the seventh transistor T7 is connected with a third scan signal line S3. A first terminal of the seventh transistor T7 and a second terminal of the fourth transistor T4 are connected with the initialization signal line Vref.

Figure 5:
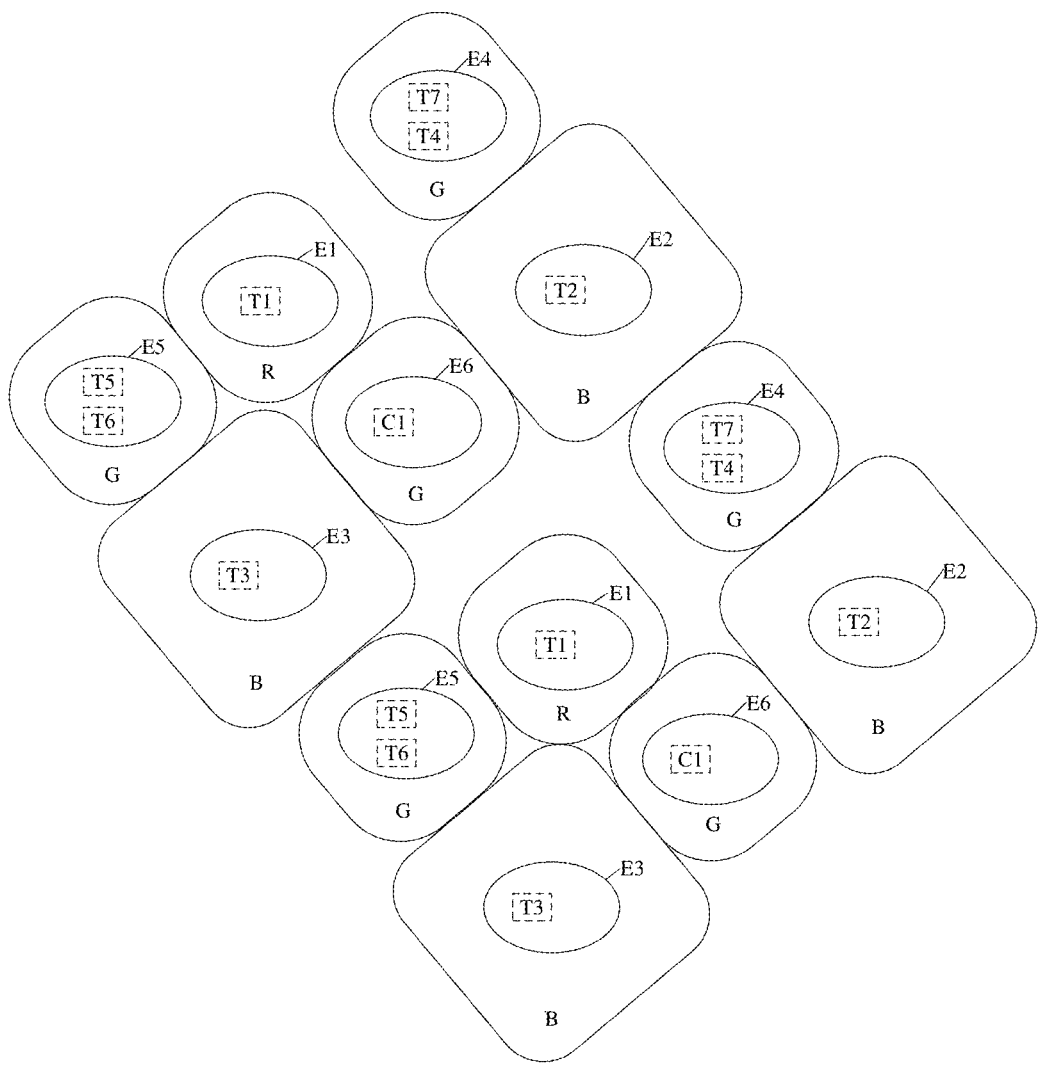
FIG. 5 shows a partial enlarged simplified schematic diagram of an example of area Q1 in FIG. 1.

In some examples, the driving elements in the first pixel circuit may be dispersedly distributed in an area covered by all the first sub-pixels driven by the first pixel circuit. FIG. 5 shows a partial enlarged simplified schematic diagram of an example of area Q1 in FIG. 1. The structure of the first pixel circuit in area Q1 is shown in FIG. 4. It is noted that FIG. 5 shows a part which is highlighted in the embodiments of the present application, in which connecting lines and other structures are omitted, and area Q1 may further include other structures, which is not limited herein.

Herein, for example, each first pixel circuit can drive six first sub-pixels, and the seven transistors and one capacitor in the first pixel circuit are dispersedly distributed in an area covered by the six first sub-pixels driven by the first pixel circuit. Area Q1 includes a plurality of first sub-pixels, which may include blue sub-pixels, red sub-pixels, and green sub-pixels. FIG. 5 shows blue sub-pixels B, red sub-pixels R and green sub-pixels G. A first electrode layer E4, a first electrode layer E5 and a first electrode layer E6 correspond to the green sub-pixel G. A first electrode layer E2 and a first electrode layer E3 correspond to the blue sub-pixel B. A first electrode layer E1 corresponds to the red sub-pixel R.

As shown in FIG. 5, the driving elements of the first pixel circuit includes a first transistor T1, a second transistor T2, a third transistor T3, a fourth transistor T4, a fifth transistor T5, a sixth transistor T6, a seventh transistor T7, and a first capacitor C1.

The first transistor T1 may be located between the first electrode layer E1 and the substrate and covered by the first electrode layer E1, that is, an orthographic projection of the first electrode layer E1 on the substrate covers an orthographic projection of the first transistor T1 on the substrate.

The second transistor T2 may be located between the first electrode layer E2 and the substrate and covered by the first electrode layer E2, that is, an orthographic projection of the first electrode layer E2 on the substrate covers an orthographic projection of the second transistor T2 on the substrate. The third transistor T3 may be located between the first electrode layer E3 and the substrate and covered by the first electrode layer E3, that is, an orthographic projection of the first electrode layer E3 on the substrate covers an orthographic projection of the third transistor T3 on the substrate. The fourth transistor T4 and the seventh transistor T7 may be located between the first electrode layer E4 and the substrate and covered by the first electrode layer E4, that is, an orthographic projection of the first electrode layer E4 on the substrate covers an orthographic projection of the fourth transistor T4 and the seventh transistor T7 on the substrate. The fifth transistor T5 and the sixth transistor T6 may be located between the first electrode layer E5 and the substrate and covered by the first electrode layer E5, that is, an orthographic projection of the first electrode layer E5 on the substrate covers an orthographic projection of the fifth transistor T5 and the sixth transistor T6 on the substrate. The first capacitor C1 may be located between the first electrode layer E6 and the substrate and covered by the first electrode layer E6, that is, an orthographic projection of the first electrode layer E6 on the substrate covers an orthographic projection of the first capacitor C1 on the substrate.

Figure 6:
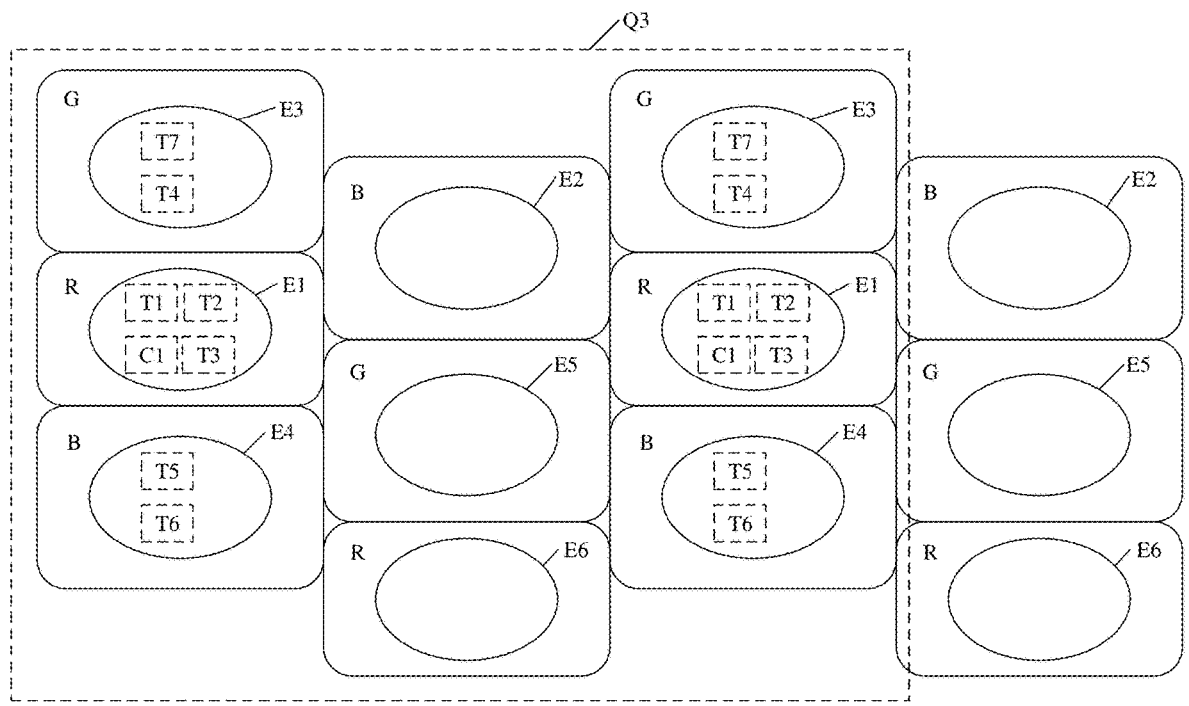
FIG. 6 shows a partial enlarged simplified schematic diagram of another example of area Q1 in FIG. 1.

In some other examples, the driving elements in the first pixel circuit may be dispersedly distributed in an area covered by a part of the first sub-pixels driven by the first pixel circuit. FIG. 6 shows a partial enlarged simplified schematic diagram of another example of area Q1 in FIG. 1.

The structure of the first pixel circuit in area Q1 is shown in FIG. 4. It is noted that FIG. 6 shows a part which is highlighted in the embodiments of the present application, in which connecting lines and other structures are omitted, and area Q1 may include other structures, which is not limited herein. Herein, for example, each first pixel circuit can drive six first sub-pixels, and the seven transistors and one capacitor in the first pixel circuit are dispersedly distributed in an area covered by four of the first sub-pixels driven by the first pixel circuit. Area Q1 includes a plurality of first sub-pixels, which may include blue sub-pixels, red sub-pixels, and green sub-pixels. FIG. 6 shows blue sub-pixels B, red sub-pixels R and green sub-pixels G. The first electrode layer E3 and the first electrode layer E5 correspond to the green sub-pixel G. The first electrode layer E2 and the first electrode layer E4 correspond to the blue sub-pixel B. The first electrode layer E1 and the first electrode layer E6 correspond to the red sub-pixel R.

The first transistor T1, the second transistor T2, the third transistor T3 and the first capacitor C1 may be located between the first electrode layer E1 and the substrate and covered by the first electrode layer E1, that is, an orthographic projection of the first electrode layer E1 on the substrate covers an orthographic projection of the first transistor T1, the second transistor T2, the third transistor T3 and the first capacitor C1 on the substrate. The fourth transistor T4 and the seventh transistor T7 may be located between the first electrode layer E3 and the substrate and covered by the first electrode layer E3, that is, an orthographic projection of the first electrode layer E3 on the substrate covers an orthographic projection of the fourth transistor T4 and the seventh transistor T7 on the substrate. The fifth transistor T5 and the sixth transistor T6 may be located between the first electrode layer E4 and the substrate and covered by the first electrode layer E4, that is, an orthographic projection of the first electrode layer E4 on the substrate covers an orthographic projection of the fifth transistor T5 and the sixth transistor T6 on the substrate. No driving element is arranged between the first electrode layer E2 and the substrate, between the first electrode layer E5 and the substrate, and between the first electrode layer E6 and the substrate.

In the embodiments of the present application, the display panel includes the first display area and the second display area. The driving elements in the first pixel circuit configured to drive the first sub-pixels in the first display area can be dispersedly distributed in an area covered by at least part of the first sub-pixels driven by the first pixel circuit, and an orthographic projection of the first electrode layer of the first sub-pixel on the substrate covers an orthographic projection of the driving element on the substrate, so as to prevent the driving elements in the first pixel circuit from shielding light, reduce the light-shielding area of the first display area, and improve the light transmission of the first display area. The light transmission of the first display area is improved, which can ensure the full-screen performance of the display panel. Furthermore, since the orthographic projection of the first electrode layer of the first sub-pixel on the substrate covers the orthographic projection of the driving element on the substrate, diffraction caused by the driving elements of the first pixel circuit can be reduced or even avoided, and thus the display performance of the display panel is improved.

In some embodiments, the driving elements in the first pixel circuit as described above may be divided into M element groups, and M is an integer greater than 1. The element group includes at least one driving element. The numbers of the driving elements in different element groups may be the same or different, which is not limited herein. The M element groups are arranged in a one-to-one correspondence with M first electrode layers in the two or more first sub-pixels driven by the first pixel circuit. In particular, an orthographic projection of one element group on the substrate is covered by an orthographic projection of one first electrode layer corresponding to this element group on the substrate.

For example, in the first pixel circuit shown in FIG. 5, the first transistor T1 forms an element group, the second transistor T2 forms an element group, the third transistor T3 forms an element group, the fourth transistor T4 and the seventh transistor T7 collectively form an element group, the fifth transistor T5 and the sixth transistor T6 collectively form an element group, and the first capacitor C1 forms an element group.

As another example, in the first pixel circuit shown in FIG. 6, the first transistor T1, the second transistor T2, the third transistor T3 and the first capacitor C1 collectively form an element group, the fourth transistor T4 and the seventh transistor T7 collectively form an element group, and the fifth transistor T5 and the sixth transistor T6 collectively form an element group.

In the embodiments described above, the driving elements in the first pixel circuit include a driving transistor. For example, the first transistor T1 in FIG. 4 is the driving transistor. Since the size of the driving transistor is relatively large, in order to improve the light transmission of the first display area and reduce the diffraction caused by the first pixel circuit, it is required that the orthographic projection of all the driving elements in the first pixel circuit on the substrate can be covered by the orthographic projection of the first electrode layer of the first sub-pixel driven by the first pixel circuit on the substrate, so that the driving transistor can be separately arranged between one first electrode layer and the substrate, and the driving elements other than the driving transistor in the first pixel circuit are arranged between other first electrode layer and the substrate; alternatively, the driving transistor and small devices such as the capacitor are separately arranged between one first electrode layer and the substrate, and the driving elements in the first pixel circuit other than the driving transistor and the small devices such as the capacitor are arranged between other first electrode layer and the substrate.

For example, the driving transistor is located between a first target electrode layer and the substrate, and an orthographic projection of the first target electrode layer on the substrate covers an orthographic projection of the driving transistor on the substrate, the first target electrode layer here is the first electrode layer of any of the two or more first sub-pixels driven by the first pixel circuit, and the driving elements other than the driving transistor in the first pixel circuit are located between the first electrode layer other than the first target electrode layer in the two or more first sub-pixels driven by the first pixel circuit and the substrate. Optionally, the driving elements includes a driving transistor and one or more capacitors, the driving transistor and the one or more capacitors are located between a second target electrode layer and the substrate, an orthographic projection of the second target electrode layer on the substrate covers an orthographic projection of the driving transistor and the one or more capacitors on the substrate, and the second target electrode layer here is the first electrode layer of any of the two or more first sub-pixels driven by the first pixel circuit, and the driving elements other than the drive transistor and the one or more capacitors in the first pixel circuit are located between the first electrode layer other than the second target electrode layer in the two or more first sub-pixels driven by the first pixel circuit and the substrate. The number of the capacitors located, with the driving transistor, between the second target electrode layer and the substrate is set according to the structure of the first pixel circuit, the sizes of the devices, and the size of the first electrode layer, etc., which is not limited herein.

In order to facilitate design and manufacturing, the driving elements connected with the same signal line in the first pixel circuit may be divided into the same element group. That is, one element group may include the driving elements connected with the same signal line in the first pixel circuit.

The signal line is for providing a signal to drive the first pixel circuit. In some examples, the signal line may include one or more of: a data signal line, a power supply signal line, a light-emitting control signal line, a scan signal line and an initialization signal line.

The data signal line may be configured to provide a data signal. The power supply signal line may be configured to provide a power supply signal. The light-emitting control signal line may be configured to provide a light-emitting control signal. The scan signal line may be configured to provide a scan signal. The initialization signal line may be configured to provide an initialization signal. For example, as shown in FIG. 4, the second transistor T2 and the third transistor T3 connected with the first scan signal line S1 may be divided into one element group; the fifth transistor T5 and the sixth transistor T6 connected with the light-emitting control signal line EM may be divided into one element group; and the fourth transistor T4 and the seventh transistor T7 connected with the initialization signal line Vref may be divided into one element group.

The driving elements connected with the same signal line are divided into one element group and arranged in the area covered by the same first sub-pixel, which facilitates design and manufacturing and can reduce the difficulty of the design and manufacturing.

In the embodiments described above, the display panel further includes connecting lines which are located in the first display area. The connecting lines may be configured to connect different driving elements in the first pixel circuit, that is, a wiring electrically connecting the driving elements in the first pixel circuit belongs to the connecting lines. Herein, the "different driving elements" do not refer to different types of driving elements and are different individual driving elements. For example, the first pixel circuit is shown in FIG. 4, the second transistor T2 and the third transistor T3 in the same first pixel circuit are different driving elements, the third transistor T3 and the first capacitor C1 in the same first pixel circuit are different driving elements, and two second transistors T2 in different first pixel circuits are also different driving elements. The connecting lines may be further configured to connect the driving elements and the signal line, that is, a wiring electrically connecting the driving elements with the signal line belong to the connecting lines. The connecting lines may be further configured to connect the driving elements with the first electrode layer so as to transmit driving signals generated by the first pixel circuit to the first electrode layer and drive the first sub-pixels, that is, a wiring electrically connecting the driving elements with the first electrode layer belong to the connecting lines.

The connecting lines described above may be metal wirings, or may be transparent wirings, or may be partly metal wirings and partly transparent wirings, which is not limited herein. The transparent wiring may include, but is not limited to, an indium tin oxide wiring, i.e., an ITO wiring. In order to further improve the light transmission of the first display area, connecting lines of transparent material may be used.

The connecting line and the structure connected with this connecting line may be arranged in the same layer, or in different layers and electrically connected through via, which is not limited herein.

In some examples, the connecting lines may be arranged in three layers. The driving elements include a transistor, and the connecting line connected with a gate of the transistor may be arranged in the same layer as the gate of the transistor. The connecting lines connected with the signal line may be arranged in the same layer as the signal line. For example, a part of the connecting lines may be arranged in the same layer as the data signal line and the power supply signal line. The connecting lines connected with the first electrode layer may be arranged in the same layer as the first electrode layer. The connecting line and the structure connected with this connecting line are arranged in the same layer, which can further simplify design and manufacturing and reduce the difficulty of the design and manufacturing.

In some embodiments, at least part of the connecting lines described above may include a first connecting line segment and a second connecting line segment. The first connecting line segment is electrically connected with the second connecting line segment. An orthographic projection of the first connecting line segment on the substrate is located within the orthographic projection of the first electrode layer on the substrate, and an orthographic projection of the second connecting line segment on the substrate is located outside the orthographic projection of the first electrode layer on the substrate. That is, the first connecting line segment may be within the area covered by the first sub-pixels and the second connecting line segment may be outside the area covered by the first sub-pixels.

The orthographic projection of the first connecting line segment on the substrate is located within the orthographic projection of the first electrode layer on the substrate, substantially no diffraction affecting the performance of the first display area is caused, and the specific wiring manner, shape, and the like of the first connecting line segment are not limited herein. The orthographic projection of the second connecting line segment on the substrate is located outside the orthographic projection of the first electrode layer on the substrate, and the second connecting line segment may be arranged as an S-shaped wiring to reduce the diffraction caused by the second connecting line segment. Further, the second connecting line segment may be arranged as a transparent wiring, so as to improve the light transmission of the first display area and reduce the diffraction caused by the second connecting line segment.

In the embodiments described above, at least part of the signal lines described above may include a first signal line segment and a second signal line segment. The first signal line segment is electrically connected with the second signal line segment. An orthographic projection of the first signal line segment on the substrate is located within the orthographic projection of the first electrode layer on the substrate, and an orthographic projection of the second signal line segment on the substrate is located outside the orthographic projection of the first electrode layer on the substrate. That is, the first signal line segment may be within the area covered by the first sub-pixels and the second signal line segment may be outside the area covered by the first sub-pixels.

The orthographic projection of the first signal line segment on the substrate is located within the orthographic projection of the first electrode layer on the substrate, substantially no diffraction affecting the performance of the first display area is caused, and the specific wiring manner, shape, and the like of the first signal line segment are not limited herein. The orthographic projection of the second signal line segment on the substrate is located outside the orthographic projection of the first electrode layer on the substrate, and the second signal line segment may be arranged as an S-shaped wiring to reduce the diffraction caused by the second signal line segment. Further, the second signal line segment may be arranged as a transparent wiring, so as to improve the light transmission of the first display area and reduce the diffraction caused by the second signal line segment.

In order to improve the light transmission of the first display area and to reduce or even eliminate diffraction occurring in the first display area, the connecting lines and the signal lines should be located in the area covered by the first sub-pixels.

In some examples, the signal line may also be considered as the connecting line. For example, the signal line is connected with the driving elements in different first pixel circuits, that is, the signal line may be considered as a connecting line between different driving elements in different first pixel circuits.

Figure 7:
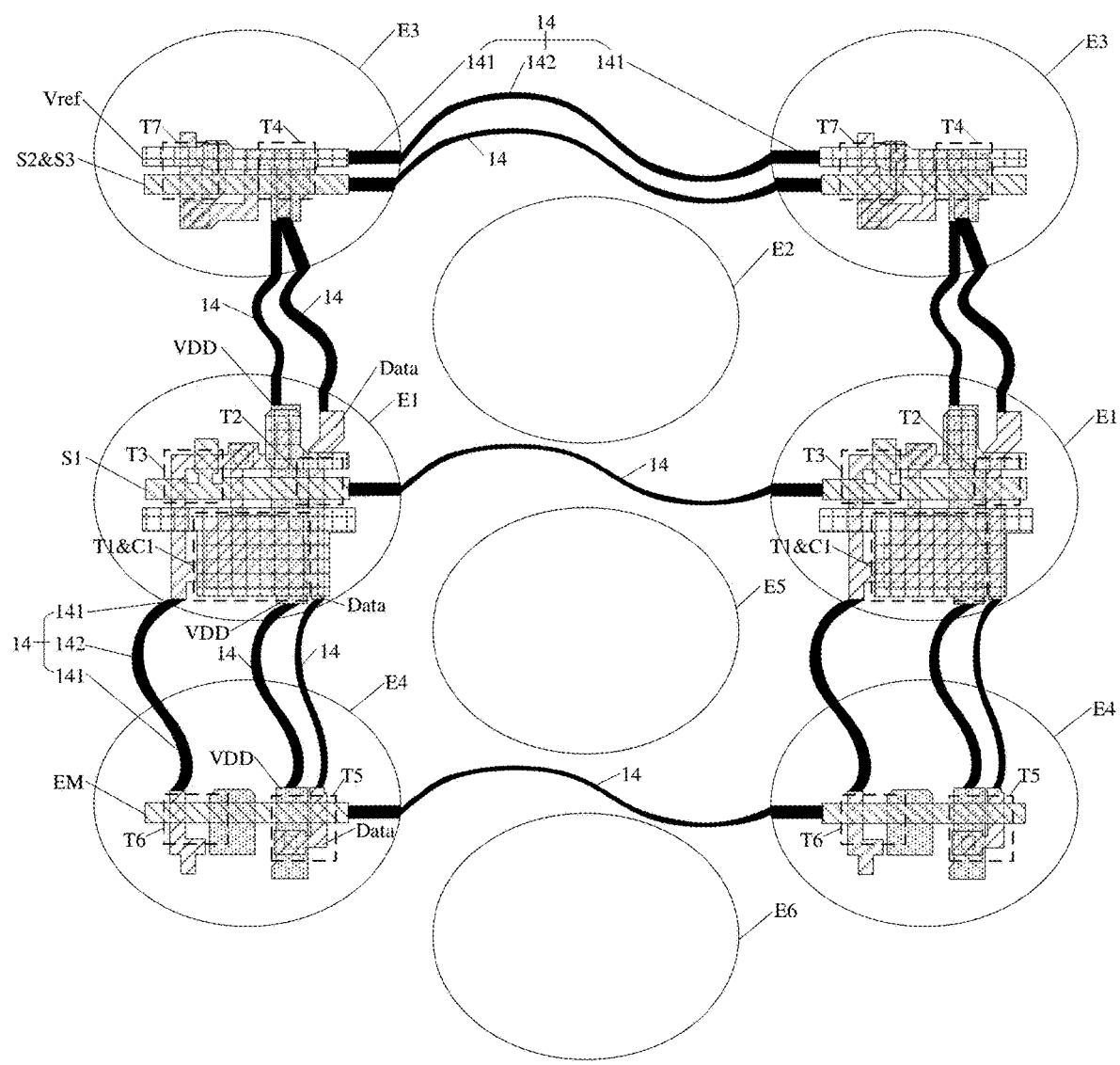
FIG. 7 shows a partial enlarged schematic diagram of an example of area Q3 in FIG. 6.

In some other examples, the connecting line between the signal lines may be considered as a connecting line between the driving elements in different first pixel circuits. For example, FIG. 7 shows a partial enlarged schematic diagram of an example of area Q3 in FIG. 6. FIG. 7 shows a first transistor T1 to a seventh transistor T7 and a first capacitor C1 in two pixel circuits, in which T1 and C1 represent the first transistor T1 and the first capacitor C1. FIG. 7 further shows signal lines including a data signal line Data, a power supply signal line VDD, a light-emitting control signal line EM, scan signal lines S1 to S3, and an initialization signal line Vref, in which S2 and S3 represent the scan signal line S2 and the scan signal line S3. FIG. 7 further shows connecting lines 14. The connecting line 14 may connect the driving elements in different first pixel circuits or different driving elements in the same pixel circuit. The connecting line 14 may include a first connecting line segment 141 and a second connecting line segment 142, an orthographic projection of the first connecting line segment 141 on the substrate is located within the orthographic projection of the first electrode layer on the substrate, and an orthographic projection of the second connecting line segment 142 on the substrate is located outside the orthographic projection of the first electrode layer on the substrate. The first connecting line segment 141 may be a straight wiring, an S-shaped wiring, or a wiring of other shapes, which is not limited herein. The second connecting line segment 142 may be an S-shaped wiring, so as to reduce or even eliminate diffraction occurring in the first display area.

The present application further provides a display apparatus. The display apparatus includes the display panel in the embodiments described above. The specific content about the display panel may be referred to the relevant illustration in the embodiments described above, and the effects of the display panel in the embodiments described above can be achieved, which are not repeated herein. The display apparatus may specifically be an apparatus with display function such as a mobile phone, a computer, a tablet computer, a television, an electronic paper, which is not limited herein.

It should be clear that the various embodiments in the specification are described in a progressive way, and the same or similar parts of the various embodiments may be referred to each other. Each embodiment focuses on the differences from other embodiments. For the display apparatus embodiments, reference is made to the description of the display panel embodiments. The present application is not limited to the specific structures described above and shown in the figures.

Various changes, modifications and additions can be made by those skilled in the art after understanding the gist of the present application. Moreover, for sake of brevity, detailed description of the known technology is omitted herein.

Those skilled in the art should understand that all the above embodiments are illustrative rather than restrictive. Different technical features recited in different embodiments can be combined to achieve beneficial effects. Those skilled in the art should be able to understand and implement other modified embodiments of the disclosed embodiments on the basis of studying the drawings, the description, and claims. In the claims, the term "comprise" does not exclude other devices or steps; the numeral word "a/an" does not exclude the plural; the terms "first" and "second" and the like are used to indicate names and not to indicate any particular order. Any reference sign in the claims should not be construed as limiting the protection scope. The functions of several parts recited in the claims can be implemented by a single hardware or software module. Some technical features are recited in different dependent claims, but this does not mean that these technical features cannot be combined to obtain beneficial effects.

What is claimed is:

1. A display panel comprising a first display area and a second display area, a light transmittance of the first display area being greater than a light transmittance of the second display area, the display panel comprising:
   a base plate comprising a substrate, and first pixel circuits arranged in the first display area, each of the first pixel circuits comprising two or more driving elements; and
   a light-emitting device layer arranged on the base plate and comprising a plurality of first sub-pixels arranged in the first display area, each of the first sub-pixels comprising a first electrode layer, a first light-emitting layer, and a second electrode layer, wherein the plurality of the first sub-pixels comprises blue sub-pixels, red sub-pixels, and green sub-pixels;
   the driving elements of the first pixel circuit comprise a driving transistor, a second transistor, a third transistor, a fourth transistor, a fifth transistor, a sixth transistor, a seventh transistor, and a first capacitor,
   an orthographic projection of the driving transistor on the substrate is covered by an orthographic projection of the first electrode layer of the red sub-pixels, and an orthographic projection of the fourth transistor on the substrate is covered by an orthographic projection of the first electrode layer of the green sub-pixels; wherein the orthographic projection of the fourth transistor on the substrate and the orthographic projection of the driving transistor on the substrate are covered by orthographic projections of first electrode layers of different first sub-pixels on the substrate; or the orthographic projection of the fourth transistor on the substrate and an orthographic projection of the second transistor on the substrate are covered by orthographic projections of first electrode layers of different first sub-pixels on the substrate; or the orthographic projection of the fourth transistor on the substrate and an orthographic projection of the third transistor on the substrate are covered by orthographic projections of first electrode layers of different first sub-pixels on the substrate, and
   an orthographic projection of the fifth transistor on the substrate is covered by an orthographic projection of the first electrode layer of the blue sub-pixels; wherein the orthographic projection of the fifth transistor on the substrate and the orthographic projection of the driving transistor on the substrate are covered by orthographic projections of first electrode layers of different first sub-pixels on the substrate; or the orthographic projection of the fifth transistor on the substrate and an orthographic projection of the second transistor on the substrate are covered by orthographic projections of first electrode layers of different first sub-pixels on the substrate; or the orthographic projection of the fifth transistor on the substrate and an orthographic projection of the third transistor on the substrate are covered by orthographic projections of first electrode layers of different first sub-pixels on the substrate; or the orthographic projection of the fifth transistor on the substrate and an orthographic projection of the forth transistor on the substrate are covered by orthographic projections of first electrode layers of different first sub-pixels on the substrate.

2. The display panel according to claim 1, wherein
   the driving elements in the first pixel circuit are divided into M element groups, each of the element groups comprises at least one driving element, and M is an integer greater than 1; and
   the M element groups are arranged in a one-to-one correspondence with M first electrode layers in the two or more first sub-pixels driven by the first pixel circuit, an orthographic projection of one element group on the substrate is covered by an orthographic projection of one first electrode layer corresponding to this element group on the substrate.

3. The display panel according to claim 2, wherein one of the element groups comprises the driving elements in the first pixel circuit connected to a same signal line for providing a signal to drive the first pixel circuit; and
   the signal line comprises one or more of:
   a data signal line, a power supply signal line, a light-emitting control signal line, a scan signal line and an initialization signal line.

4. The display panel according to claim 1, further comprising:
   connecting lines located in the first display area and configured to connect different driving elements in the first pixel circuit, connect the driving elements with a signal line, and connect the driving elements with the first electrode layer, and the signal line being configured to provide a signal to drive the first pixel circuit; and
   the signal line comprises one or more of:
   a data signal line, a power supply signal line, a light-emitting control signal line, a scan signal line, and an initialization signal line.

5. The display panel according to claim 4, wherein
   the driving elements comprise a transistor, and the connecting line connected with a gate of the transistor is arranged in the same layer as the gate of the transistor.

6. The display panel according to claim 4, wherein
   the connecting lines connected with the signal line are arranged in the same layer as the signal line; and
   the connecting lines connected with the first electrode layer are arranged in the same layer as the first electrode layer.

7. The display panel according to claim 4, wherein
   the connecting line comprises a first connecting line segment and a second connecting line segment, the first connecting line segment is electrically connected with the second connecting line segment, an orthographic projection of the first connecting line segment on the substrate is within the orthographic projection of the first electrode layer on the substrate, and an orthographic projection of the second connecting line segment on the substrate is outside the orthographic projection of the first electrode layer on the substrate.

8. The display panel according to claim 7, wherein the second connecting line segment is an S-shaped wiring; and the second connecting line segment is a transparent wiring.

9. The display panel according to claim 4, wherein
the signal line comprises a first signal line segment and a second signal line segment, the first signal line segment is electrically connected with the second signal line segment, an orthographic projection of the first signal line segment on the substrate is within the orthographic projection of the first electrode layer on the substrate, and an orthographic projection of the second signal line segment on the substrate is outside the orthographic projection of the first electrode layer on the substrate.

10. The display panel according to claim 9, wherein the second signal line segment is an S-shaped wiring; and the second signal line segment is a transparent wiring.

11. The display panel according to claim 4, wherein
the second display area comprises a first area and a second area, the first area is located between the second area and the first display area, and a light transmittance of the first area is greater than a light transmittance of the second area.

12. The display panel according to claim 1, wherein the orthographic projection of the fourth transistor on the substrate and the orthographic projection of the driving transistor on the substrate are covered by orthographic projections of first electrode layers of different first sub-pixels on the substrate.

13. The display panel according to claim 1, wherein the orthographic projection of the fifth transistor on the substrate and an orthographic projection of the forth transistor on the substrate are covered by orthographic projections of first electrode layers of different first sub-pixels on the substrate.

14. The display panel according to claim 1, wherein the orthographic projection of the fifth transistor on the substrate and an orthographic projection of the third transistor on the substrate are covered by orthographic projections of first electrode layers of different first sub-pixels on the substrate.

15. The display panel according to claim 1, wherein the orthographic projection of the fourth transistor on the substrate and the orthographic projection of the driving transistor on the substrate are covered by orthographic projections of first electrode layers of different first sub-pixels on the substrate; and the orthographic projection of the fourth transistor on the substrate and an orthographic projection of the second transistor on the substrate are covered by orthographic projections of first electrode layers of different first sub-pixels on the substrate; and the orthographic projection of the fourth transistor on the substrate and an orthographic projection of the third transistor on the substrate are covered by orthographic projections of first electrode layers of different first sub-pixels on the substrate, and
the orthographic projection of the fifth transistor on the substrate and the orthographic projection of the driving transistor on the substrate are covered by orthographic projections of first electrode layers of different first sub-pixels on the substrate; and the orthographic projection of the fifth transistor on the substrate and an orthographic projection of the second transistor on the substrate are covered by orthographic projections of first electrode layers of different first sub-pixels on the substrate; and the orthographic projection of the fifth transistor on the substrate and an orthographic projection of the third transistor on the substrate are covered by orthographic projections of first electrode layers of different first sub-pixels on the substrate; and the orthographic projection of the fifth transistor on the substrate and an orthographic projection of the forth transistor on the substrate are covered by orthographic projections of first electrode layers of different first sub-pixels on the substrate.

16. The display panel according to claim 1, wherein
a first terminal of the second transistor is connected with a data signal line, a second terminal of the second transistor is connected with a first terminal of the driving transistor,
a first terminal of the fourth transistor is connected with an initialization signal line, a second terminal of the fourth transistor is connected with a control terminal of the driving transistor,
a first terminal of the third transistor is connected with the control terminal of the driving transistor, a second terminal of the third transistor is connected with a second terminal of the driving transistor,
control terminals of the fifth transistor and the sixth transistor are connected with a light-emitting control signal line,
a first terminal of the fifth transistor and a first terminal of the first capacitor are connected with a power supply signal line, a second terminal of the first capacitor is connected with the control terminal of the driving transistor, a second terminal of the fifth transistor is connected with the first terminal of the driving transistor.

17. A display panel comprising a first display area and a second display area, a light transmittance of the first display area being greater than a light transmittance of the second display area, the display panel comprising:
a base plate comprising a substrate, and first pixel circuits arranged in the first display area, each of the first pixel circuits comprising two or more driving elements; and
a light-emitting device layer arranged on the base plate and comprising a plurality of first sub-pixels arranged in the first display area, each of the first sub-pixels comprising a first electrode layer, a first light-emitting layer, and a second electrode layer, wherein the plurality of the first sub-pixels comprises blue sub-pixels, red sub-pixels, and green sub-pixels;
the driving elements of the first pixel circuit comprise a driving transistor, a second transistor, a third transistor, a fourth transistor, a fifth transistor, a sixth transistor, a seventh transistor, and a first capacitor,
an orthographic projection of the driving transistor on the substrate is covered by an orthographic projection of the first electrode layer of the red sub-pixels, and an orthographic projection of the fourth transistor on the substrate is covered by an orthographic projection of the first electrode layer of the green sub-pixels; wherein the orthographic projection of the fourth transistor on the substrate and the orthographic projection of the driving transistor on the substrate are covered by orthographic projections of first electrode layers of different first sub-pixels on the substrate, and
wherein the orthographic projection of the fifth transistor on the substrate and an orthographic projection of the third transistor on the substrate are covered by orthographic projections of first electrode layers of different first sub-pixels on the substrate; and the orthographic projection of the fifth transistor on the substrate and an orthographic projection of the forth transistor on the substrate are covered by orthographic projections of first electrode layers of different first sub-pixels on the substrate.

18. The display panel according to claim 17, wherein
a first terminal of the second transistor is connected with a data signal line, a second terminal of the second transistor is connected with a first terminal of the driving transistor,
a first terminal of the fourth transistor is connected with an initialization signal line, a second terminal of the fourth transistor is connected with a control terminal of the driving transistor,
a first terminal of the third transistor is connected with the control terminal of the driving transistor, a second terminal of the third transistor is connected with a second terminal of the driving transistor,
control terminals of the fifth transistor and the sixth transistor are connected with a light-emitting control signal line,
a first terminal of the fifth transistor and a first terminal of the first capacitor are connected with a power supply signal line, a second terminal of the first capacitor is connected with the control terminal of the driving transistor, a second terminal of the fifth transistor is connected with the first terminal of the driving transistor.

19. A display panel comprising a first display area and a second display area, a light transmittance of the first display area being greater than a light transmittance of the second display area, the display panel comprising:
a base plate comprising a substrate, and first pixel circuits arranged in the first display area, each of the first pixel circuits comprising two or more driving elements; and
a light-emitting device layer arranged on the base plate and comprising a plurality of first sub-pixels arranged in the first display area, each of the first sub-pixels comprising a first electrode layer, a first light-emitting layer, and a second electrode layer, wherein the plurality of the first sub-pixels comprises blue sub-pixels, red sub-pixels, and green sub-pixels;
the driving elements of the first pixel circuit comprise a driving transistor, a second transistor, a third transistor, a fourth transistor, a fifth transistor, a sixth transistor, a seventh transistor, and a first capacitor, an orthographic projection of the fourth transistor on the substrate is covered by an orthographic projection of the first electrode layer of the green sub-pixels; wherein the orthographic projection of the fourth transistor on the substrate and the orthographic projection of the driving transistor on the substrate are covered by orthographic projections of first electrode layers of different first sub-pixels on the substrate; and
an orthographic projection of the fifth transistor on the substrate is covered by an orthographic projection of the first electrode layer of the blue sub-pixels; wherein the orthographic projection of the fifth transistor on the substrate and an orthographic projection of the third transistor on the substrate are covered by orthographic projections of first electrode layers of different first sub-pixels on the substrate; and the orthographic projection of the fifth transistor on the substrate and an orthographic projection of the forth transistor on the substrate are covered by orthographic projections of first electrode layers of different first sub-pixels on the substrate.

20. The display panel according to claim 19, wherein
a first terminal of the second transistor is connected with a data signal line, a second terminal of the second transistor is connected with a first terminal of the driving transistor,
a first terminal of the fourth transistor is connected with an initialization signal line, a second terminal of the fourth transistor is connected with a control terminal of the driving transistor,
a first terminal of the third transistor is connected with the control terminal of the driving transistor, a second terminal of the third transistor is connected with a second terminal of the driving transistor,
control terminals of the fifth transistor and the sixth transistor are connected with a light-emitting control signal line,
a first terminal of the fifth transistor and a first terminal of the first capacitor are connected with a power supply signal line, a second terminal of the first capacitor is connected with the control terminal of the driving transistor, a second terminal of the fifth transistor is connected with the first terminal of the driving transistor.

* * * * *